United States Patent
Gangoso et al.

(10) Patent No.: US 7,847,568 B2
(45) Date of Patent: Dec. 7, 2010

(54) MULTI-SITE PROBE

(75) Inventors: Andrew Gangoso, Markham (CA); Liane Martinez, North York (CA)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 11/840,587

(22) Filed: Aug. 17, 2007

(65) Prior Publication Data
US 2009/0045827 A1   Feb. 19, 2009

(51) Int. Cl.
*G01R 31/02* (2006.01)
(52) U.S. Cl. .................................. 324/754; 324/765
(58) Field of Classification Search ......... 324/754–765; 439/482
See application file for complete search history.

(56) References Cited

U.S. PATENT DOCUMENTS

| | | | | |
|---|---|---|---|---|
| 4,038,599 | A * | 7/1977 | Bove et al. | 324/754 |
| 4,692,205 | A * | 9/1987 | Sachdev et al. | 174/256 |
| 5,410,259 | A | 4/1995 | Fujihara et al. | |
| 5,804,983 | A | 9/1998 | Nakajima et al. | |
| 6,383,825 | B1 * | 5/2002 | Farnworth et al. | 438/14 |
| 6,407,568 | B1 | 6/2002 | Mulligan et al. | |
| 6,501,289 | B1 | 12/2002 | Takekoshi | |
| 6,535,004 | B2 | 3/2003 | Mehta et al. | |
| 6,552,559 | B2 | 4/2003 | Hiromatsu | |
| 6,586,956 | B2 | 7/2003 | Aldaz et al. | |
| 6,674,296 | B1 | 1/2004 | Duckworth et al. | |
| 7,009,412 | B2 * | 3/2006 | Chong et al. | 324/754 |
| 2002/0063558 | A1 | 5/2002 | Takeuchi et al. | |
| 2003/0025517 | A1 | 2/2003 | Kiest et al. | |
| 2005/0212546 | A1 * | 9/2005 | Lynch | 324/765 |
| 2007/0170935 | A1 * | 7/2007 | Huang et al. | 324/754 |

FOREIGN PATENT DOCUMENTS

| | | |
|---|---|---|
| EP | 1548450 A2 | 6/2005 |
| EP | 1906215 A1 | 4/2008 |
| EP | 1965422 A1 | 9/2008 |
| WO | WO2007007852 | 1/2007 |

OTHER PUBLICATIONS

MicroProbe, Inc.; Apollo™ Array Flat Tip Vertical Technology Product Sheet; Nov. 26, 2002.
MicroProbe, Inc.; Apollo™ Pointed Tip Vertical Technology Product Sheet; Nov. 26, 2002.
MJC Probe Inc.; MPI-VPC Technology for Dual Site Flip Chip IC Presentation; Apr. 6, 2007.

(Continued)

*Primary Examiner*—Ha Tran T Nguyen
*Assistant Examiner*—Arleen M Vazquez
(74) *Attorney, Agent, or Firm*—Timothy M. Honeycutt

(57) ABSTRACT

Various probe substrates for probing a semiconductor die and methods of use thereof are disclosed. In one aspect, a method of manufacturing is provided that includes forming a first matrix array of conductor pins and a second matrix array of conductor pins on a probe substrate. The second matrix array of conductor pins is separated from the first matrix array of conductor pins by a first pitch along a first axis selected to substantially match a second pitch between a first semiconductor die and a second semiconductor die of a semiconductor workpiece.

21 Claims, 4 Drawing Sheets

OTHER PUBLICATIONS

Tokyo Electron; P-12XL Product Sheet; http://www.tel.com/eng/product/wps/wpsp12x1.htm; Jul. 24, 2007.

Tokyo Electron; Wafer Probe Systems Information Sheet; http://www.tel.com/eng/product/wps/buwps.htm; Jul. 24, 2007.

Teradyne, Inc.; UltraFlex Product Sheet; http://www.teradyne.com/flex/ultraflex.html; Aug. 1, 2007.

Wentworth Laboratories, Inc.; *Array Probe Card Product* Web Page; http://www.wentworthlabs.com/product/cobra.htm; pp. 1-3; Jun. 2001.

Kulicke & Soffa Industries, Inc.; CobraProbe Advantage for Vertical Probing Web Page; http://www.kns.com/prodserv/pdfs/test/CobraProbe.pdf; pp. 1-4; 2001.

PCT/IB2008/002158 International Search Report.

* cited by examiner

MULTI-SITE PROBE

BACKGROUND OF THE INVENTION

1. Field of the Invention

This invention relates generally to semiconductor processing, and more particularly to systems and methods of probe testing semiconductor chips.

2. Description of the Related Art

Current integrated circuits routinely include many tens or even hundreds of millions of transistors and other circuit devices configured in arrangements of staggering complexity. Not surprisingly, testing of integrated circuits is vital to ensure that both the huge numbers of circuit devices and the myriad of manufacturing steps required to make those devices meet or exceed design specifications. One type of electrical test routinely performed on integrated circuits is performed at the wafer level and involves establishing ohmic contact with certain areas of an integrated circuit using a special instrument known as a probe system. After ohmic contact is established, the tester of the probe system electrically stimulates the integrated circuit in a variety of ways to test various functionalities thereof. Another type of testing for chips destined for packages is performed after the individual chips are diced from the wafer and mounted into packages.

A conventional probe system consists of a prober, which is an instrument designed to hold a semiconductor wafer and step it to various positions so that the individual dice thereof can be brought into selected contact with a tester, which is another instrument that typically performs the actual electrical stimulation of the individual dice. In one conventional set up, a probe card is mounted to the prober and used to establish the ohmic contact with the semiconductor wafer. The probe card consists of a stack of a printed circuit board, a semiconductor chip package substrate, and a probe head. The printed circuit board holds the probe substrate and is configured to perform a relatively low-speed testing on the integrated circuits of the semiconductor wafer. The probe substrate is similar in design to a semiconductor chip package substrate. The probe substrate typically includes a collection of conductor pins that project away from the substrate and are used to establish the ohmic contact with areas on the semiconductor dice of the wafer.

One conventional variant of a probe substrate includes an array of pins that are capable of contacting not only peripheral areas of an integrated circuit but also internal areas, such as solder bumps in the case of a flip-chip type integrated circuit. Another conventional variant of a probe substrate includes two or more collections of conductor pins that are typically configured to contact peripheral, but not internal areas of an integrated circuit. The conventional single array probe substrate is limited to probing a single semiconductor die at a time. The conventional dual site probe substrate is capable of multi-site probing, but only for peripheral areas of an integrated circuit.

An additional drawback of conventional probe systems is the low-speed capabilities of the conventional probe stack printed circuit board. Thus, at the wafer test level, only relatively low speed tests may be performed. High-speed tests that can identify additional types of faults and defects that will render a given die as scrap, must await final package testing. Thus, there are often instances where one or more dice on a semiconductor wafer have defects that remain latent during wafer level testing only to be revealed during final test after packaging. In those instances, otherwise defective dice nevertheless undergo dicing, packaging and package level testing before such defects are discovered. If yield limiting defects can be discovered earlier in the fabrication cycle, manufacturing and testing costs can be lowered.

The present invention is directed to overcoming or reducing the effects of one or more of the foregoing disadvantages.

SUMMARY OF THE INVENTION

In accordance with one aspect of the present invention, a method of manufacturing is provided that includes forming a first matrix array of conductor pins and a second matrix array of conductor pins on a probe substrate. The second matrix array of conductor pins is separated from the first matrix array of conductor pins by a first pitch along a first axis selected to substantially match a second pitch between a first semiconductor die and a second semiconductor die of a semiconductor workpiece.

In accordance with another aspect of the present invention, a method is provided that includes engaging a first pair of semiconductor dice of a semiconductor workpiece that has a plurality of semiconductor dice with a probe substrate that has a first matrix array of conductor pins and a second matrix array of conductor pins. The second matrix array of conductor pins is separated from the first matrix array of conductor pins by a first pitch along a first axis selected to substantially match a second pitch between the semiconductor dice of the first pair of semiconductor dice of the semiconductor workpiece. Electrical probe testing is performed on the first pair of semiconductor dice.

In accordance with another aspect of the present invention, an apparatus is provided that includes a probe substrate that has a first matrix array of conductor pins and a second matrix array of conductor pins. The second matrix array of conductor pins is separated from the first matrix array of conductor pins by a first pitch along a first axis selected to substantially match a second pitch between a semiconductor die and a second semiconductor die of a semiconductor workpiece.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
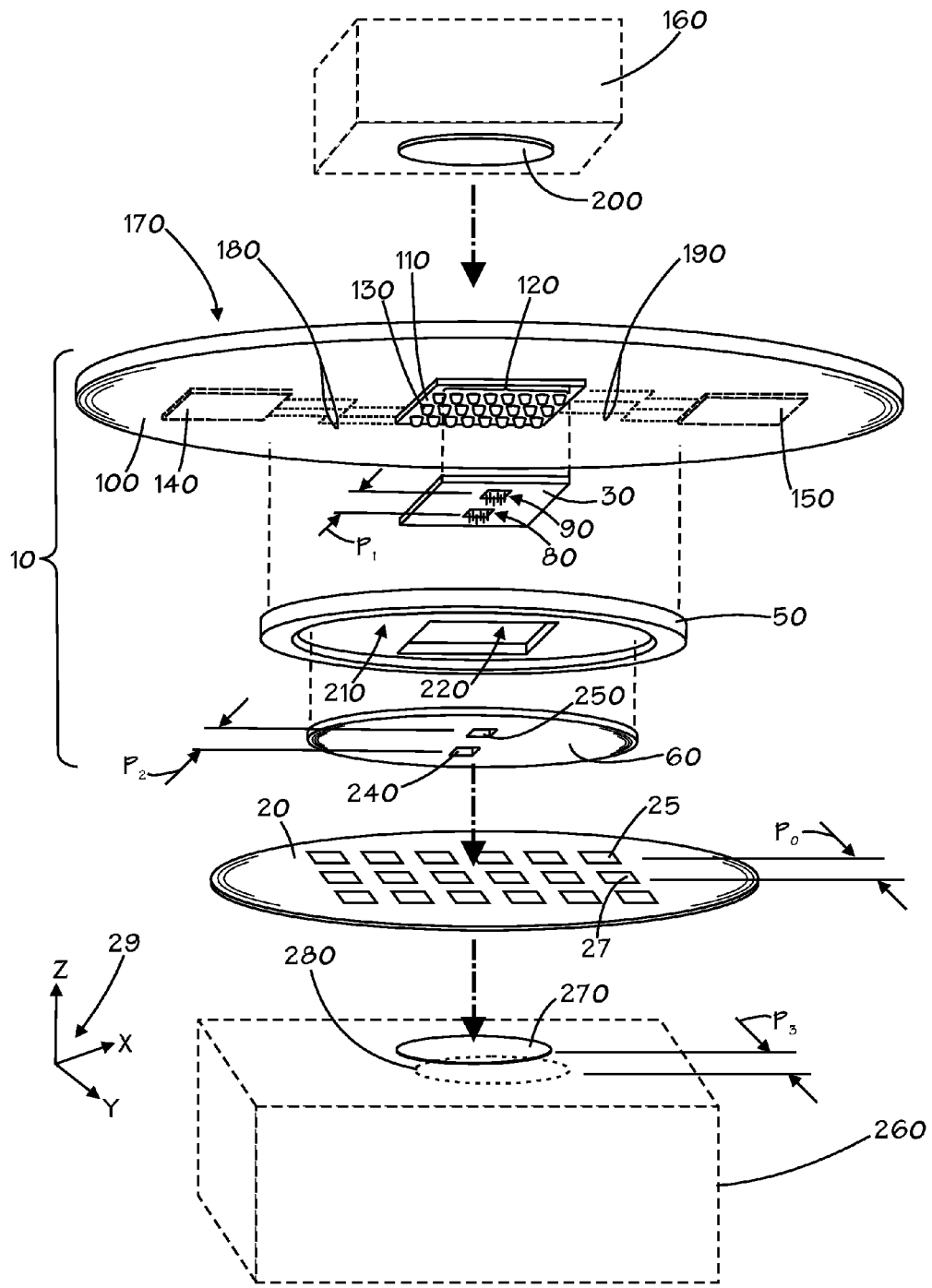
FIG. 1 is an exploded pictorial view of an exemplary embodiment of an integrated circuit probe card stack that is suitable for vertical electrical probing of a semiconductor workpiece or wafer.

In the drawings described below, reference numerals are generally repeated where identical elements appear in more than one figure. Turning now to the drawings, and in particular to FIG. 1, therein is shown an exploded pictorial view of an exemplary embodiment of an integrated circuit probe card stack 10 (stack 10) that is suitable for vertical electrical probing of a semiconductor workpiece or wafer 20. The wafer 20 includes a plurality of integrated circuits or semiconductor dice, two of which are labeled 25 and 27. The semiconductor workpiece 20 may be composed of silicon, germanium or other semiconductor materials. If desired, the wafer 20 may be configured as a semiconductor-on-insulator wafer. The dice of the wafer 20, such as the dice 25 and 27, may be integrated circuits that function as processors, application specific integrated circuits, memory devices or the like. The dice 25 and 27 are separated by some pitch $P_0$ measured along an axis parallel to a Y-axis of a coordinate system 29. The stack 10 includes a probe substrate 30, a printed circuit board 40, a mounting bracket 50 and a head 60.

The probe substrate 30 is provided with a pair of matrix style pin arrays 80 and 90 that are spaced apart by a pitch $P_1$ measured along an axis parallel to the Y-axis. The significance of the pitch $P_1$ will be explained later. As described in more detail below, the probe substrate 30 and the accompanying pin arrays 80 and 90 may be used to probe test two semiconductor dice at a time, such as the dice 25 and 27. Because the pin arrays 80 and 90 are matrix style, the substrate 30 enables dual site vertical probing of more than just peripheral chip areas. The probe substrate 30 is shown exploded from a printed circuit board 100. When the stack 10 is fully assembled, the probe substrate 30 is seated on the printed circuit board 100. More particularly, the probe substrate 30 may be seated on a bond pad area 110 on the printed circuit board 100 that is provided with an interconnect array 120 that may consist of a plurality of solder bumps 130 or other types of interconnect structures. The probe substrate 30 has a corresponding plurality of interconnect structures that are not visible in FIG. 1, but interface with the interconnect array 120 on the bond area 110. To electrically connect to the interconnect array 120, the probe substrate 30 may be configured as a pin grid array, a ball grid array, a land grid array or any other type of interconnect scheme as desired.

The printed circuit board 100 maybe provided with one or more so-called POGO pads 140 and 150 that include a plurality of upwardly projecting bumps or other conductor structures that are designed to be electrically tapped with an instrument, such as a tester represented schematically by the dashed box 160. The POGO pads 140 and 150 are positioned on the side 170 of the printed circuit board 100 opposite the location of the probe substrate 30, and thus are depicted in phantom. The number and location of the pads 140 and 150 may be varied to suit the needs of the probe substrate 30, the semiconductor wafer 20 and the tester 160 among others. The printed circuit board 100 is provided with a plurality of conductor structures or traces 180 which electrically connect the POGO pad 150 to the bond pad 110, and thus the probe substrate 30. The POGO pad 160 may be similarly tied electrically to the probe substrate 30 by plural conductor structures 190. The traces 180 and 190 may be positioned on, in, or both on and in the substrate 30. The number and layout of the traces 180 and 190 are subject to design discretion.

The tester 160 may include an interface 200 that is used to contact the POGO pads 140 and 150. It should be understood that FIG. 1 is not drawn to scale in that the tester 160 maybe substantially larger than the printed circuit board 100. A variety of instruments may be used for the tester 160. Exemplary systems include, for example, the Ultraflex by Teradyne, Inc. and the Pinscale by Agilent.

If desired, the printed circuit board 100, including the traces 180 and 190, may be designed to perform wafer level testing at speeds lower than the native clock speeds of the individual semiconductor dice 25 and 27. In this regard, dual site full matrix probing may be performed. However, an added benefit may be obtained by tailoring the printed circuit board 100 to have the attributes of both a loadboard and a probe card. In this way, the printed circuit board 100 and the probe substrate 30 may be used to probe test the wafer 20 at or very near the native clock speed(s) of the individual semiconductor dice 25 and 27. As noted in the Background section hereof, conventional vertical probe testing is performed using a printed circuit board that is outfitted for low clock speed testing. Thus, a wafer consisting of dice clocking natively at about 2.0 GHz may be conventionally probed at some fraction of that speed, such as 200 to 300 MHZ. As a result, high speed testing must await dicing and final packaging of the dice 25 and 27. By having to wait until package testing, manufacturers must often unwittingly expend processing resources on dice that ultimately turn out to be defective. Load board/probe card characteristics may be built into the printed circuit board by configuring the various conductor traces 180 and 190 for high speed signal propagation and by directly mounting the probe substrate 30 to the printed circuit board 100 without any intervening boards, cards etc.

The mounting bracket 50 may be connected to the printed circuit board 100 by screws, adhesives, solder or other well-known fastening techniques. The bracket 50 may be composed of well-known plastics, ceramics or the like. The bracket 50 includes a space 210 sized to accommodate the head 60. In addition, the bracket 50 includes an opening 220 that is designed to enable the pin arrays 80 and 90 to project through when the bracket 50 is seated on the printed circuit board 100.

The head 60 may be configured as a disk-like structure designed to protect the probe substrate 30. The head 60 may be connected to the printed circuit board 100 by screws, adhesives, solder or other well-known fastening techniques. The head 60 may be composed of well-known plastics, ceramics or the like. A pair of openings 240 and 250 are provided in the head 60. The openings 240 and 250 are sized and spaced with a pitch $P_2$ to match the pitch $P_1$ of the pin arrays 80 and 90 of the probe substrate 30. Thus, when assembled, the head 60 is positioned in the space 210 and the pin arrays 80 and 90 project through the openings 240 and 250 respectively.

To perform a probe test, both the wafer 20 and the stack 10 are seated on a prober, which is represented schematically by a dashed box 260. The prober 260 includes a movable chuck 270 upon which the wafer 20 is seated. The chuck 270 is typically movable in a plane, such as the plane represented by the X-Y axes. The chuck 270 may be moved or stepped along a given axis, such as the Y-axis, in increments with a pitch $P_3$. The position of the chuck 270 after one stepping movement is represented by the dashed oval 280. The stepping pitch $P_3$ of the chuck 270 may be the same or larger than the dice pitch $P_0$. The pitch $P_1$ of the pin arrays 80 and 90 of the probe substrate 30 is advantageously selected to match the stepping pitch $P_3$ of the chuck 270. Of course, the prober 260 is operable to receive the probe stack 10, typically in a fixed position. With the stack 10 secured to the prober 260, the tester 160 is moved downward parallel to the Z-axis to contact the POGO pads 140 and 150 and the chuck 270 is moved upward parallel to the Z-axis until the wafer 20 contacts the pin arrays 80 and 90. During testing, the chuck 270 is stepped to various dice. A variety of instruments may be used as the prober 260. In an exemplary embodiment, a Tokyo Electron model P-12XL may be used. It should be understood that FIG. 1 is not drawn to scale in that the prober 260 may be substantially larger than the wafer 20.

Various components of the stack 10 are depicted as disk-like structures. However, the skilled artisan will appreciate that other than circular shapes may be used for the printed circuit board 100, the head 60, and the mounting bracket 50.

Figure 2:
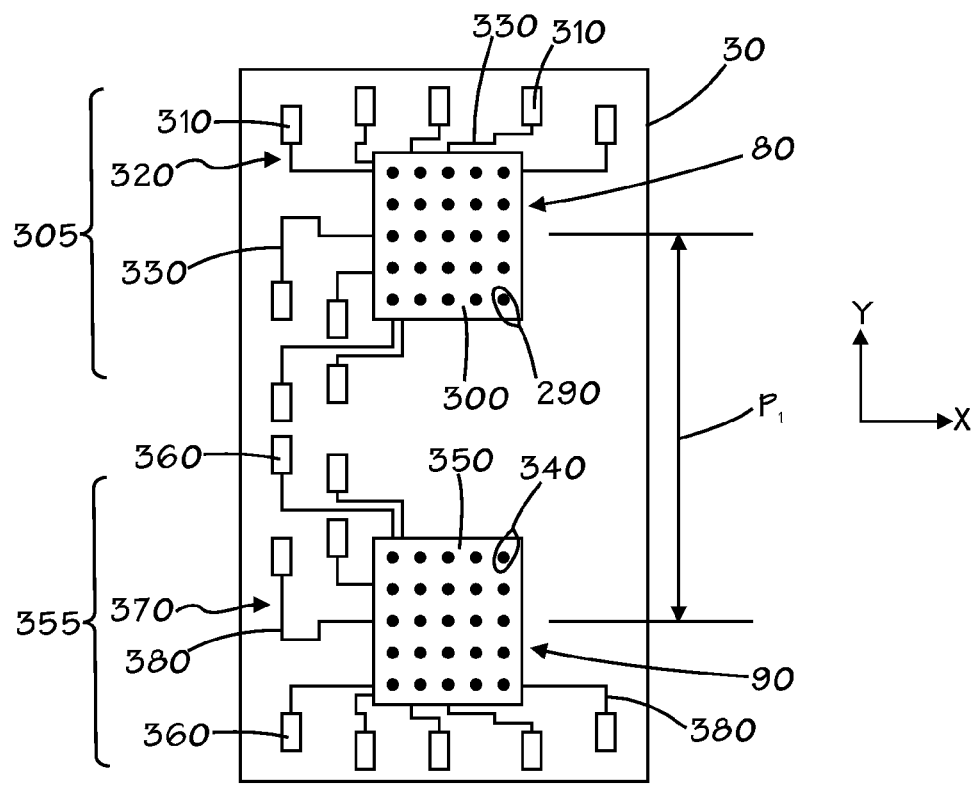
FIG. 2 is a plan view of an exemplary embodiment of a probe substrate.

Additional details of the probe substrate 30 may be understood by referring now to FIG. 2, which is an overhead view. The substrate 30 may be organic, ceramic or the like. If organic, the substrate 30 may be fabricated as a standard core, a thin core or a coreless, and composed of well-known epoxies and fillers or the like. If ceramic, the substrate 30 may be configured using well-known ceramic materials. As noted above in conjunction with the discussion of FIG. 1, the pin arrays 80 and 90 may be spaced with a pitch $P_1$ designed to match the stepping pitch $P_3$ of the chuck 270 shown in FIG. 1.

Still referring to FIG. 2, the pin array 80 consists of a matrix array of pins represented by the black dots 290 that are disposed on a bond area 300. As used herein, the term matrix array is intended to mean an arrangement of pins suitable to engage central as well as peripheral sites of an integrated circuit. The matrix array may consist of rows and columns that may or may not be equal in number and may or may not include a pin at every location in the array. The pins 290 may be composed of a variety of conductor materials, such as gold, copper, silver, aluminum, platinum, tantalum, nickel, mixtures of these or the like. The bond area 300 may be configured substantially identically to a bond area of the type used for a flip-chip mounted integrated circuit. For example, the bond area may include a plurality of solder structures to which the pins 290 are respectively bonded. Indeed, a performance goal of the probe substrate 30 is to mimic as closely as possible the electrical behavior of a semiconductor chip package substrate suitable for use with one of the semiconductor dice 25 and 27 of the wafer 20 depicted in FIG. 1. Most semiconductor chip package substrates include several capacitors and other devices for filtering and other requirements. Accordingly, the probe substrate 30 and the pin array 80 thereof may be provided with a circuitry system 305 that includes a plurality of passive devices 310 and an interconnect scheme 320. The interconnect scheme 320 may consist of a plurality of interconnects or conductor traces, a couple of which are labeled 330. The conductor traces 330 may consist of surface positioned traces as depicted in FIG. 2, as well as conductor structures and interconnects that are positioned within the body of the substrate 30 and thus not visible in FIG. 2. Again, it should be noted that the interconnect scheme 320 and the passive devices 310 are intended to mimic as closely as possible the electrical behavior of a package substrate for a semiconductor chip. The passive devices 310 may consist of capacitors, inductors, resistors or other types of devices. The traces 330 may be composed of a variety of conductor materials, such as gold, copper, silver, aluminum, platinum, tantalum, nickel, mixtures of these or the like.

The pin array 90 similarly consists of a plurality of pins that are represented by the black dots 340 that are arrayed in a matrix-like fashion on a bonding area 350. Like the pin array 80, the pin array 90 is provided with a circuitry system 355 that includes a plurality of passive devices 360 that are connected to the pins 340 and to other areas of the substrate 30 by way of an interconnect scheme 370 that consists of a plurality of conductor traces, a couple of which are labeled 380, that may be substantially the same as the conductor traces 210 of the scheme 200.

Figure 3:
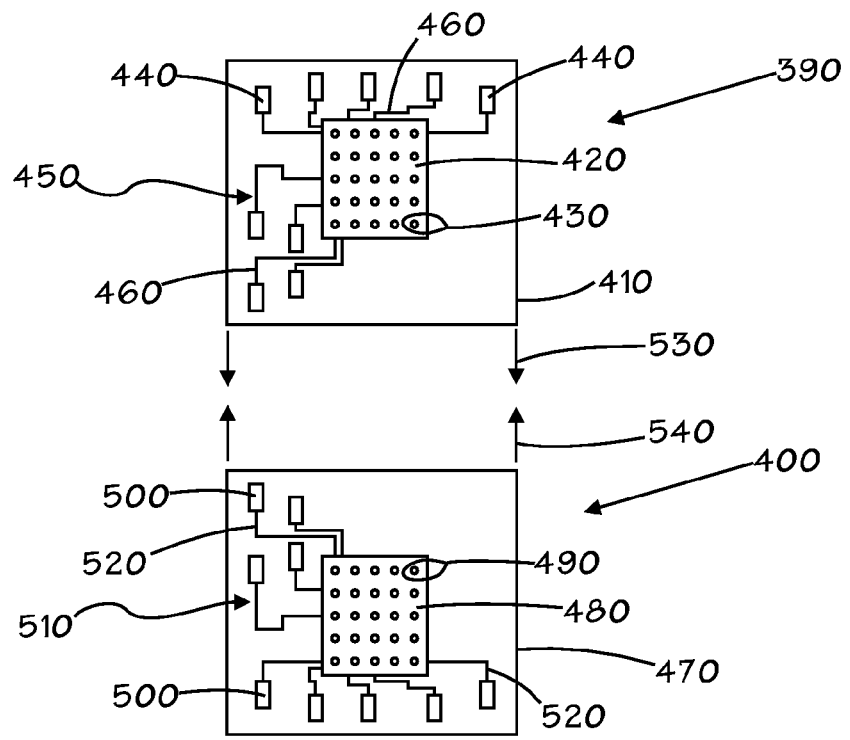
FIG. 3 is a plan view depicting exemplary layouts of semiconductor chip package substrates used to create an exemplary layout of a probe substrate.

An exemplary method for creating a layout for the probe substrate 30 depicted in FIG. 2 may be understood by referring now to FIG. 3, which is an overhead view of the layouts 390 and 400 of two semiconductor chip package substrates. The layout 390 includes a design for a substrate 410, a bonding area 420 that includes a plurality of bond sites 430, a plurality of passive devices 440 and an interconnect scheme 450 that consists of one or more conductor traces 460. The layout 390 is not unlike a typical layout for a semiconductor chip package substrate that is, in-turn, used as a single site probe substrate for conventional vertical probe testing.

The layout 400 similarly consists of a design for a substrate 470 and a bonding area 480 that includes a plurality of bump sites 490. A plurality of passive devices 500 and an interconnect scheme 510 that consists of a plurality of traces 520 are also provided. The two layouts 390 and 400 may be considered to be essentially mirror image copies. In order to produce the layout for the probe substrate 30 depicted in FIG. 2, the two layouts 390 and 400 are merged, as suggested by the arrows 530 and 540 into a single layout to be produced on a single substrate, such as the substrate 30 with the goal of creating minimal disruptions to the interconnect schemes 450 and 510. As noted elsewhere herein, it is desirable to design the probe substrate 30 in such a way that the electrical behavior of the circuitry that includes the pin array 80 and the circuitry that includes the pin array 90 mimic as closely as possible the actual electrical behavior of two package substrates.

Figure 4:
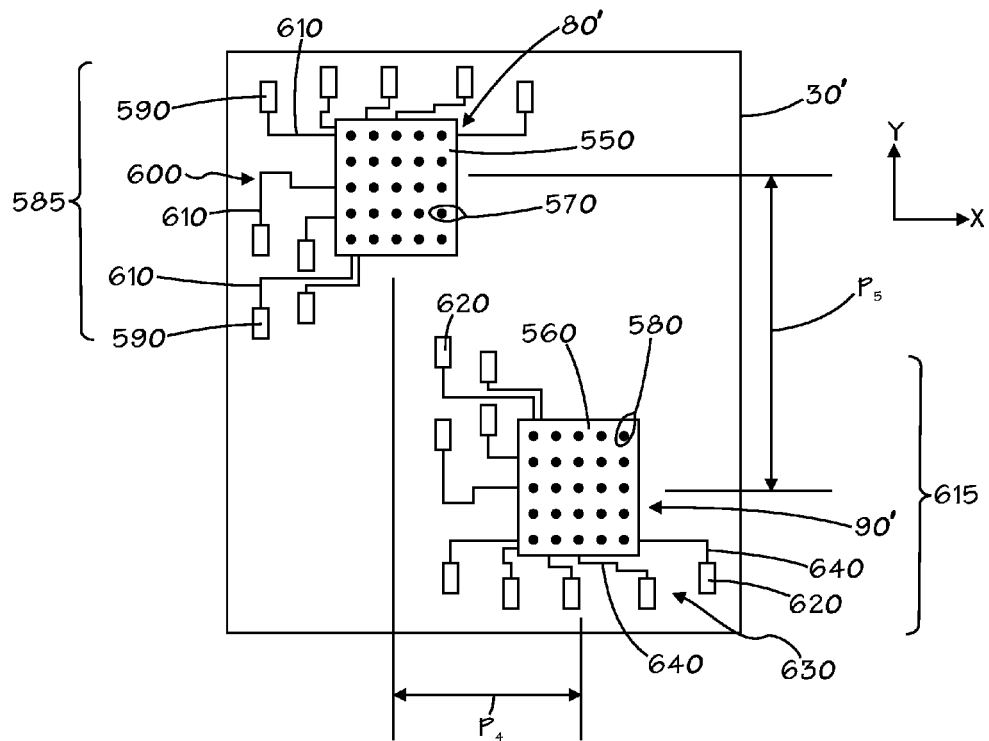
FIG. 4 is a plan view of an alternate exemplary embodiment of a probe substrate.

In the foregoing illustrative embodiment, the pin arrays 80 and 90 of the probe substrate 30 are aligned along an arbitrarily selected Y-axis that is generally parallel to one edge of the probe substrate 30. However, it is possible to use a different alignment of pin arrays so that, for example, concurrent probing may be performed on semiconductor dice that are at staggered relative positions on a wafer. In this regard, FIG. 4 depicts an overhead view of an alternate exemplary embodiment of a probe substrate 30' that is provided with respective pin arrays 80' and 90' that are staggered with a horizontal pitch $P_4$ along a X-axis and a vertical pitch $P_5$ along a Y-axis. The terms vertical and horizontal are intended to be arbitrary. The probe substrate 30' may be composed of the same materials and with the same structure generally described elsewhere herein for the other disclosed embodiment. The pin arrays 80' and 90' may be formed on respective bonding areas 550 and 560 and may consist of respective pluralities of pins 570 and 580. The pin array 80' maybe tied to a circuitry system 585 that includes plurality of passive devices 590 and other electrical structures by way of an interconnect scheme 600 that includes a plurality of traces, two of which are labeled 610. The pin array 90' may be similarly provided with a circuitry system 615 that has a plurality of passive devices 620 and an interconnect scheme 630 consisting of one or more traces 640.

As with the other disclosed embodiment, the probe substrate 30' is designed to mimic the electrical behavior of two semiconductor chip package substrates, albeit simultaneously if desired and with staggered layouts as disclosed in FIG. 4. The pitches $P_4$ and $P_5$ may be designed to match the staggered pitches of two semiconductor dice on a given wafer, such as the wafer 20 depicted in FIG. 1 or the pitch of step movement of the probe instrument chuck 270 depicted in FIG. 1. Additionally, the pitches $P_4$ and $P_5$ may be equal or unequal.

Figure 5:
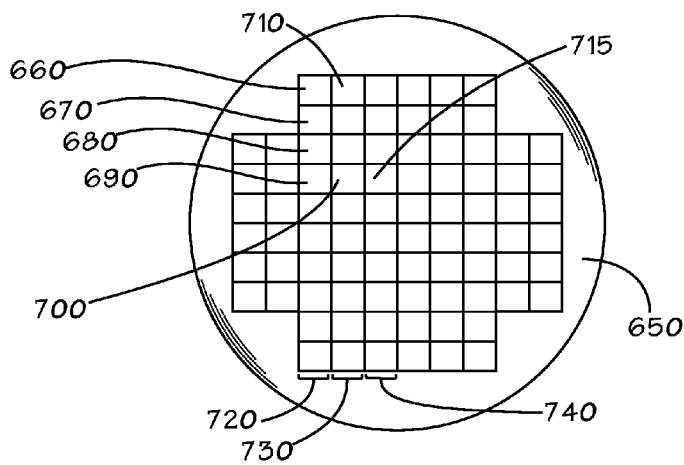
FIG. 5 is a plan of a semiconductor wafer and some exemplary probe test schemes therefor.

FIG. 5 is an overhead view of an exemplary semiconductor wafer 650 that includes a plurality of semiconductor dice. A few of the dice are individually labeled 660, 670, 680, 690, 700, 710 and 715. The dice 660, 670, 680 and 690 are positioned in a column 720 of dice. The dice 700 and 710 are similarly positioned in a dice column 730, and the die 715 is located in a dice column 740. A probe substrate design of the type depicted in FIGS. 1 and 2 may be used to simultaneously probe the semiconductor dice in a variety of patterns. For example, and depending on the pitches $P_1$ and $P_3$ (see FIG. 1), the dice 660 and 670 in the column 720 may be concurrently probed followed by the dice 680 and 690 and so on for the column 720. If the pitches $P_1$ and $P_3$ are larger than adjacent dice, then the die 660 may be probed concurrently with the die 680 followed by the combination of the dice 670 and 690 and so on for the column 720. The same would hold true for the other columns 730 and 740, etc. Of course the probe substrate 30 (see FIGS. 1 and 2) may be oriented in such a way that dice configured along an orthogonal direction, such as the dice 660 and 710 and other dice parallel to those two, may be probed simultaneously or at least with a probe position at the same general position.

If the probe substrate is configured in a staggered design, as is the case for the substrate 30' shown in FIG. 4, then, for example, the die 660 and the die 700 may be probed simultaneously followed by the die 710 and the die 715 simultaneously and so on and so forth for the remaining dice. Again, the exact order in which the dice on the wafer 650 are probed will depend upon the pitches, such as the pitches $P_1$, $P_4$ and $P_5$ disclosed in FIGS. 2 and 4, as well as the available stepping pitches of the instrument to which the probe cards 30 or 30' are connected.

Figure 6:
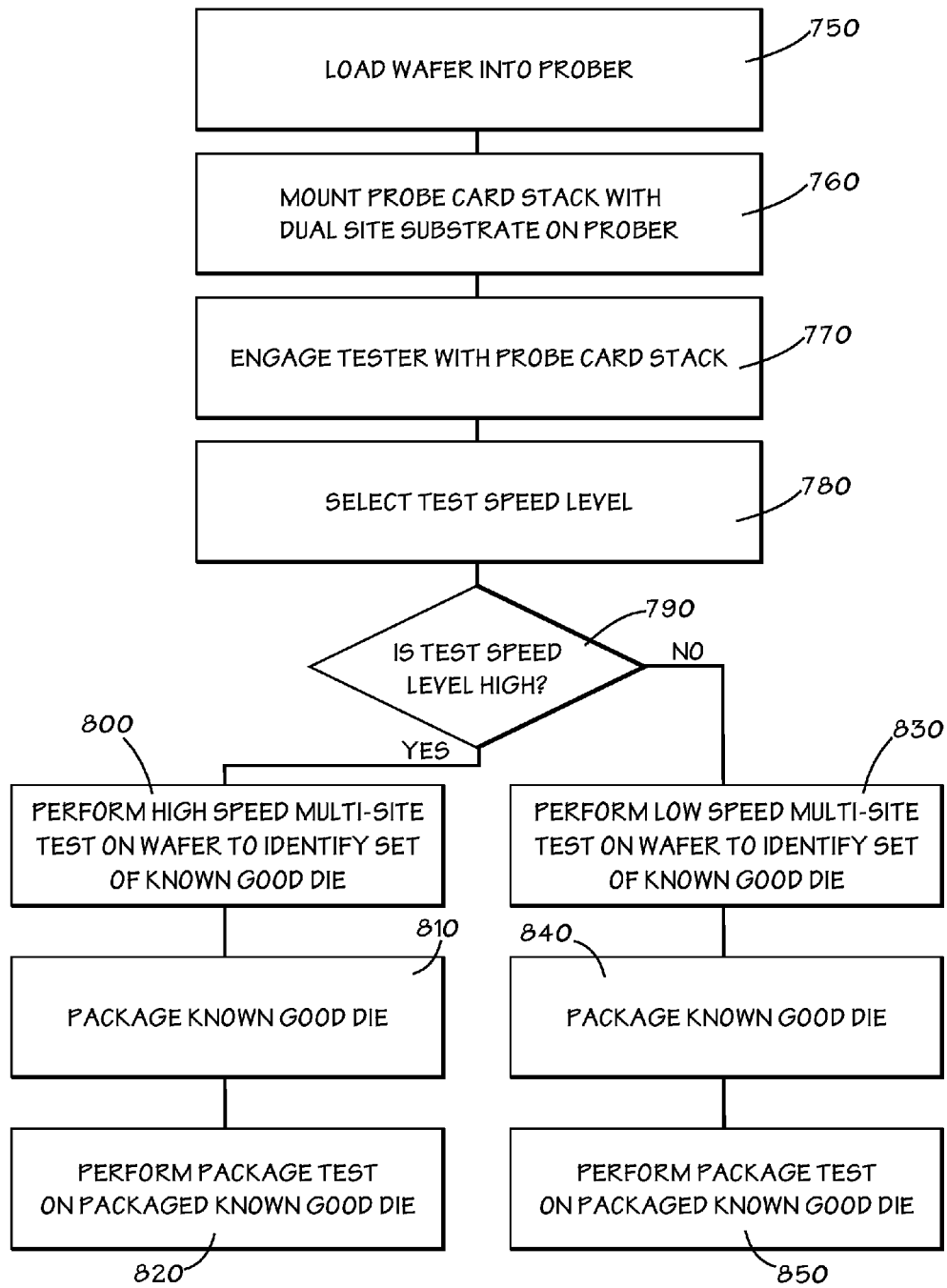
FIG. 6 is a flow chart of an exemplary method of multi-site probe testing.

FIG. 6 is a flow chart of an exemplary method of testing and manufacturing that utilizes the multi-site probe substrate and an enhanced loadboard configured probe stack as disclosed herein. At step 750, a wafer is loaded into a prober. For example, the semiconductor wafer 20 disclosed in FIG. 1 may be loaded into the exemplary prober 260. Next, at step 760, the probe card stack of the type disclosed herein, such as the stack 10, is mounted on the prober. At step 770, a tester, such as the tester 160 shown in FIG. 1, is brought into engagement with the probe card stack. At this point, or before as desired, the speed level for the probe test is selected as indicated at step 780. For example, the probe test speed level may be selected to be HIGH, which is at some level that is at or relatively close to the native clock speed of the integrated circuits on the wafer. For example, the dice on the wafer 20 shown in FIG. 1 may have some design native clock speed of, for example, 2.0 GHz. The 2.0 GHz figure is merely exemplary. Depending on the wafer 20, the dice thereon may have a range of native clock speeds where some chips clock out higher than others. Optionally, the probe test speed level may be selected to be LOW that is at some speed level lower than the native clock speed of the chips on the wafer. The selected test speed level is entered into the control system of the tester. It should be understood that the multiple dice may be tested at their respective native clock speeds. Next, and as indicated at step 790, a decision is made by the tester to perform either a high level or low level test. If a high speed level test is selected, then at step 800, a high speed multi-site test is performed on the wafer to identify a set of known good die for the wafer. The high speed multi-site test may consist of a variety of different types of electrical tests performed on the dice of the wafer. Examples of tests include: scan, scan chain, programmable logic, input/output XOR, digital to analog conversion, internal loop back, universal serial bus, PCI express, and serial ATA to name just a few. The number and types of tests will depend on the type of die on the wafer and the capabilities of the tester and prober. With a set of known good die identified, the wafer may be diced and the known good die segregated from the defective die. The known good die may then be packaged as indicated in step 810. The benefit here is that only those dice that are identified as known good die through the high speed testing will be subjected to packaging and final test. Material and labor costs associated with packaging and final testing defective dice will be saved. Next, and as indicated in step 820, the packaged known good die may be subjected to one or more packaged tests, such as, for example, an operating system test, power short testing, a scan and an I/O XOR test. As noted above, this package testing may be performed only on the previously identified set of known good die.

If, on the other hand, the tester is programmed to proceed with a low speed test at step 790, then at step 830, a low speed multi-site test may be performed on the dice of the wafer to identify a set of known good die. Here, some exemplary testing may include, for example: scan, scan chain, programmable logic, input/output XOR to name just a few. The set of known good die identified at step 830 may include some dice that are in fact defective but that cannot be identified as such using low speed testing alone. Next and as suggested at step 840, the set of known good die identified through the low speed test at step 830 are diced and packaged. Finally, in step 850, the packaged known good die may be subjected to final package testing. Even if the steps 830, 840 and 850 are followed, significant efficiency may be achieved through the use of the multi-site matrix array probe substrate that enables more efficient probe testing of the individual dice on a semiconductor wafer.

The probe substrates 30 and 30' disclosed herein are provided with two pin arrays 80 and 90 or 80' and 90'. However, the skilled artisan will appreciate that any of the embodiments of the probe substrates 30 and 30' disclosed herein may be provided with more than two pin arrays so that two or more dice may be probed.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
   forming a first matrix array of conductor pins on a probe substrate;
   forming a second matrix array of conductor pins on the probe substrate, the second matrix array of conductor pins being separated from the first matrix array of conductor pins by a first pitch along a first axis selected to substantially match a second pitch between a first semiconductor die and a second semiconductor die of a semiconductor workpiece; and
   forming a first circuitry system on the probe substrate electrically connected to the first matrix array of conductor pins and a second circuitry system on the probe substrate electrically connected to the second matrix array of conductor pins, the first circuitry system having a first layout providing electrical characteristics of a package substrate adapted for the first semiconductor die and the second circuitry system having a second layout providing electrical characteristics of a package substrate adapted for the second semiconductor die.

2. The method of claim 1, wherein the forming the first circuitry system comprises forming a first plurality of passive devices and a first plurality of interconnects and the forming the second circuitry systems comprises forming a second plurality of passive devices and a second plurality of interconnects.

3. The method of claim 1, wherein the first and second matrix arrays of conductor pins are formed such that the second matrix array of conductor pins is separated from the first matrix array of conductor pins by a third pitch along a second axis selected to substantially match a fourth pitch between the first semiconductor die and the second semiconductor die of the semiconductor workpiece.

4. The method of claim 1, comprising coupling the probe substrate to a printed circuit board.

5. The method of claim 4, comprising coupling the printed circuit board to a prober.

6. The method of claim 1, comprising forming a third matrix array of conductor pins on the probe substrate.

7. A method, comprising:
engaging a first pair of semiconductor dice of a semiconductor workpiece having a plurality of semiconductor dice with a probe substrate having a first matrix array of conductor pins and a second matrix array of conductor pins on the probe substrate, the second matrix array of conductor pins being separated from the first matrix array of conductor pins by a first pitch along a first axis selected to substantially match a second pitch between the semiconductor dice of the first pair of semiconductor dice of the semiconductor workpiece, a first circuitry system on the probe substrate electrically connected to the first matrix array of conductor pins and a second circuitry system on the probe substrate electrically connected to the second matrix array of conductor pins, the first circuitry system having a first layout providing electrical characteristics of a package substrate adapted for the first semiconductor die and the second circuitry system having a second layout providing electrical characteristics of a package substrate adapted for the second semiconductor die; and
performing electrical probe testing on the first pair of semiconductor dice.

8. The method of claim 7, wherein one of the first pair of semiconductor dice has a first native clock speed and the second of the first pair of semiconductor dice has a second native clock speed, the method comprising coupling the probe substrate to a printed circuit board having circuitry adapted to probe test the semiconductor dice of the first pair of semiconductor dice substantially at their respective native clock speeds.

9. The method of claim 7, comprising engaging other pairs of semiconductor dice of the semiconductor workpiece with the probe substrate and performing electrical probe testing on the other pairs of semiconductor dice.

10. The method of claim 7, comprising using results of the electrical probe testing of the pairs of semiconductor dice to identify any known good die of the semiconductor workpiece.

11. The method of claim 10, comprising placing the known good die into semiconductor chip packages.

12. The method of claim 11, comprising performing electrical testing on the known good die.

13. The method of claim 7, wherein the probe substrate includes a third matrix array of conductor pins, the method comprising performing electrical probe testing on another of the plurality of semiconductor dice with the third matrix array of conductor pins.

14. An apparatus, comprising:
a probe substrate having a first matrix array of conductor pins and a second matrix array of conductor pins, the second matrix array of conductor pins being separated from the first matrix array of conductor pins by a first pitch along a first axis selected to substantially match a second pitch between a first semiconductor die and a second semiconductor die a semiconductor workpiece; and
a first circuitry system on the probe substrate electrically connected to the first matrix array of conductor pins and a second circuitry system on the probe substrate electrically connected to the second matrix array of conductor pins, the first circuitry system having a first layout providing electrical characteristics of a package substrate adapted for the first semiconductor die and the second circuitry system having a second layout providing electrical characteristics of a package substrate adapted for the second semiconductor die.

15. The apparatus of claim 14, wherein the first circuitry system comprises a first plurality of passive devices and a first plurality of interconnects and the second circuitry systems comprises a second plurality of passive devices and a second plurality of interconnects.

16. The apparatus of claim 14, wherein the second matrix array of conductor pins is separated from the first matrix array of conductor pins by a third pitch along a second axis selected to substantially match a fourth pitch between the first semiconductor die and the second semiconductor die of the semiconductor workpiece.

17. The apparatus of claim 14, comprising a printed circuit board coupled to the probe substrate.

18. The apparatus of claim 17, wherein the printed circuit board comprises a loadboard.

19. The apparatus of claim 17, comprising a prober coupled to the printed circuit board.

20. The apparatus of claim 17, comprising a tester adapted to electrically couple to the printed circuit board.

21. The apparatus of claim 14, wherein the probe substrate comprises a third matrix array of conductor pins.

* * * * *